(12) United States Patent
Lee et al.

(10) Patent No.: US 8,022,616 B2
(45) Date of Patent: Sep. 20, 2011

(54) ORGANIC LIGHT EMITTING DISPLAY APPARATUS

(75) Inventors: Byoung-Duk Lee, Suwon-si (KR); Jong-Hyuk Lee, Suwon-si (KR); Yoon-Hyeung Cho, Suwon-si (KR); Min-Ho Oh, Suwon-si (KR); So-Young Lee, Suwon-si (KR); Sun-Young Lee, Suwon-si (KR); Won-Jong Kim, Suwon-si (KR); Yong-Tak Kim, Suwon-si (KR); Jin-Baek Choi, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 495 days.

(21) Appl. No.: 11/951,283

(22) Filed: Dec. 5, 2007

(65) Prior Publication Data

US 2008/0138657 A1    Jun. 12, 2008

(30) Foreign Application Priority Data

Dec. 6, 2006  (KR) .................. 10-2006-0123371

(51) Int. Cl.
*H01J 1/62* (2006.01)
*H01J 63/04* (2006.01)
(52) U.S. Cl. ...................... 313/504; 313/512
(58) Field of Classification Search .............. 313/504, 313/512; 428/690
See application file for complete search history.

(56) References Cited

U.S. PATENT DOCUMENTS

| | | | | |
|---|---|---|---|---|
| 4,268,127 A | * | 5/1981 | Oshima et al. | 349/96 |
| 5,173,800 A | * | 12/1992 | King | 359/360 |
| 6,410,168 B1 | | 6/2002 | Tamura | |
| 7,067,975 B2 | * | 6/2006 | Chen et al. | 313/512 |
| 2002/0030440 A1 | | 3/2002 | Yamazaki | |
| 2003/0027369 A1 | | 2/2003 | Yamazaki | |
| 2003/0080679 A1 | | 5/2003 | Ishii et al. | |

(Continued)

FOREIGN PATENT DOCUMENTS

EP   1 441 571 A1   7/2004

(Continued)

OTHER PUBLICATIONS

Japanese Office action dated Feb. 23, 2010, corresponding to Japanese application 2007171084, noting listed references in this IDS.

(Continued)

*Primary Examiner* — Nimeshkumar Patel
*Assistant Examiner* — Glenn Zimmerman
(74) *Attorney, Agent, or Firm* — Christie, Parker & Hale, LLP

(57) ABSTRACT

An organic light emitting display apparatus that has high (or improved) contrast and/or impact resistance. The organic light emitting display apparatus includes: a substrate; an organic light emitting device on the substrate to display an image; a sealing member on the organic light emitting device; a semitransparent film on a surface of the sealing member facing away from the organic light emitting device to transmit a portion of external light and to reflect another portion of the external light; a passivation film on the semitransparent film to protect the semitransparent film; and a transmissive black layer between the sealing member and the organic light emitting device to increase contrast, wherein the semitransparent film has a refractive index greater than that of the passivation film.

22 Claims, 5 Drawing Sheets

U.S. PATENT DOCUMENTS

| | | |
|---|---|---|
| 2003/0146446 A1 | 8/2003 | Yamazaki et al. |
| 2003/0183830 A1 | 10/2003 | Yamazaki et al. |
| 2005/0225238 A1* | 10/2005 | Yamazaki ................. 313/506 |
| 2006/0139254 A1* | 6/2006 | Hayakawa et al. ............ 345/76 |
| 2006/0186399 A1* | 8/2006 | Yamazaki et al. ............. 257/40 |
| 2007/0085075 A1* | 4/2007 | Yamazaki et al. ............. 257/40 |
| 2007/0103061 A1* | 5/2007 | Li ................................. 313/504 |
| 2007/0116934 A1* | 5/2007 | Miller .......................... 428/172 |

FOREIGN PATENT DOCUMENTS

| | | |
|---|---|---|
| EP | 1 585 175 A2 | 10/2005 |
| EP | 1 772 215 A1 | 4/2007 |
| JP | 2000-172198 | 6/2000 |
| JP | 2002-071905 | 3/2002 |
| JP | 2002-324667 | 11/2002 |
| JP | 2003-303679 | 10/2003 |
| JP | 2005-293946 | 10/2005 |
| JP | 2005-331910 | 12/2005 |
| JP | 2006-54163 | 2/2006 |
| KR | 2003-0010334 | 2/2003 |
| KR | 10-2005-0034126 | 4/2005 |
| WO | WO 2006/001310 A1 | 1/2006 |
| WO | WO 2006/125988 A1 | 11/2006 |

OTHER PUBLICATIONS

Patent Abstracts of Japan, Publication No. 2006-054163, dated Feb. 23, 2006, in the name of Hidekazu Kobayashi.

Korean Patent Abstracts, Publication No. 1020030010334 A, dated Feb. 5, 2003, in the name of Kyung Young Suk.

Korean Patent Abstracts, Publication No. 1020050034126 A, dated Apr. 14, 2005, in the name of Hwang Shin Cho et al.

European Search Report dated May 2, 2011, for corresponding European Patent application 07254721.9, noting listed references in this IDS.

* cited by examiner

ORGANIC LIGHT EMITTING DISPLAY APPARATUS

CROSS-REFERENCE TO RELATED PATENT APPLICATION

This application claims priority to and the benefit of Korean Patent Application No. 10-2006-0123371, filed on Dec. 6, 2006, in the Korean Intellectual Property Office, the entire content of which is incorporated herein by reference.

BACKGROUND OF THE INVENTION

1. Field of the Invention

The present invention relates to an organic light emitting display apparatus, and, more particularly, to an organic light emitting display apparatus with high contrast and/or impact resistance.

2. Description of the Related Art

Organic and inorganic organic light emitting display apparatuses are flat panel display apparatuses that can be made to be relatively thin and portable. In addition, organic and inorganic organic light emitting display apparatuses are emissive type (or self-emissive type) display apparatuses that have relatively wide viewing angle, high contrast, and short response time. Also, the organic light emitting display apparatuses, in which a light emitting layer is formed of an organic material, have higher brightness, lower driving voltage, and shorter response time than the inorganic light emitting display apparatus, and can also provide multi-colored images.

Flat panel display apparatuses are manufactured to be relatively lightweight and thin so that the flat panel display apparatuses can be portable and be used outdoors. However, when the flat panel display apparatuses are used outdoors, the contrast and visibility of the flat panel display apparatuses may be reduced due to the reflection of sunlight. In particular, for organic light emitting display apparatuses, the reflection of sunlight at a metal reflection film of the organic light emitting display apparatuses can be severe.

Also, there is a high possibility that an external surface of the organic light emitting display apparatuses can be damaged by external impact.

SUMMARY OF THE INVENTION

An aspect of an embodiment of the present invention is directed toward an organic light emitting display apparatus with high contrast and/or impact resistance.

According to an embodiment of the present invention, an organic light emitting display apparatus is provided. The organic light emitting apparatus includes: a substrate; an organic light emitting device on the substrate to display an image; a sealing member on the organic light emitting device; a semitransparent film on a surface of the sealing member facing away from the organic light emitting device to transmit a portion of external light and to reflect another portion of the external light; a passivation film on the semitransparent film to protect the semitransparent film; and a transmissive black layer between the sealing member and the organic light emitting device to increase contrast, wherein the semitransparent film has a refractive index greater than that of the passivation film.

The transmissive black layer may include graphite or diamond like carbon (DLC).

The passivation film may include a thermosetting resin. The thermosetting resin of the passivation film may include a urethane acrylate or an epoxy resin.

The semitransparent film may have an optical transmittance ranging from about 40 to about 80%.

The semitransparent film may have a refractive index ranging from about 1.5 to about 5.0.

The semitransparent film may include a metal colloid layer.

The semitransparent film may include Ag, Au, or Ti.

According to another embodiment of the present invention, an organic light emitting display apparatus is provided. The organic light emitting apparatus includes: a substrate; an organic light emitting device on the substrate to display an image; a sealing member on the organic light emitting device; a semitransparent film on a surface of the sealing member facing away from the organic light emitting device to transmit a portion of external light and to reflect another portion of the external light; a passivation film on the semitransparent film to protect the semitransparent film; a black matrix layer in a region corresponding to a non-display region of the organic light emitting device; and a transmissive black layer between the sealing member and the organic light emitting device to increase contrast, wherein the semitransparent film has a refractive index greater than that of the passivation film.

According to another embodiment of the present invention, an organic light emitting display apparatus is provided. The organic light emitting apparatus includes: a substrate; an organic light emitting device on the substrate and including a first electrode, a second electrode, and an organic light emitting layer between the first electrode and the second electrode; an insulating film on the first electrode and including an opening to expose a portion of the first electrode; a sealing member for sealing the organic light emitting device; a semitransparent film on a surface of the sealing member facing away from the organic light emitting device to transmit a portion of external light and to reflect another portion of the external light; a passivation film on the semitransparent film to protect the semitransparent film; and a transmissive black layer between the sealing member and the organic light emitting device to increase contrast, wherein the organic light emitting layer and the second electrode are sequentially disposed on the portion of the first electrode exposed through the opening defined by the insulating film, wherein the semitransparent film has a refractive index greater than that of the passivation film, and wherein the insulating film has a dark color to reduce reflection of the external light.

According to another embodiment of the present invention, an organic light emitting display apparatus is provided. The organic light emitting apparatus includes: a substrate; an organic light emitting device on the substrate and including a first electrode, a second electrode, and an organic light emitting layer between the first electrode and the second electrode; an insulating film formed on the first electrode and including an opening to expose a portion of the first electrode; a sealing member for sealing the organic light emitting device; a semitransparent film on a surface of the sealing member facing away from the organic light emitting device to transmit a portion of external light and to reflect another portion of the external light; a passivation film on the semitransparent film to protect the semitransparent film; and a black matrix layer in a region corresponding to a non-display region of the organic light emitting device; a transmissive black layer between the sealing member and the organic light emitting device to increase contrast, wherein the organic light emitting layer and the second electrode are sequentially disposed on the portion of the first electrode exposed through the opening defined by the insulating film, wherein the semitransparent film has a refractive index greater than that of the passivation film, and wherein the insulating film has a dark color to reduce reflection of the external light.

The dark color of the insulating film may be a black color to reduce reflection of the external light.

The black matrix layer may be adapted to absorb the external light.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
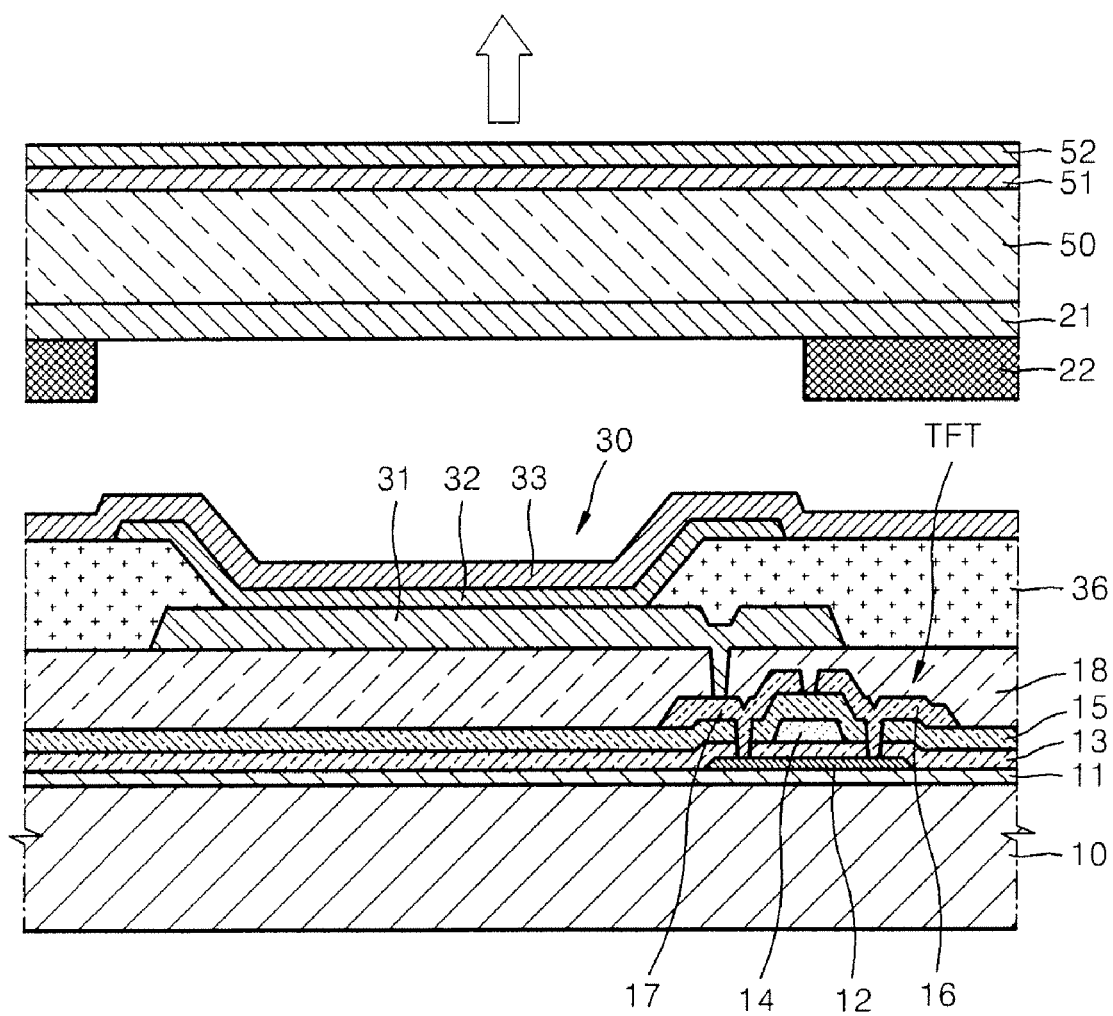
FIG. 1 is a schematic cross-sectional view illustrating an organic light emitting display apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a schematic cross-sectional view illustrating an organic light emitting display apparatus according to an embodiment of the present invention. Organic light emitting display apparatuses can be classified as active matrix (AM) type organic light emitting display apparatuses or passive matrix (PM) type organic light emitting display apparatuses. The organic light emitting display apparatus depicted in FIG. 1 is an AM type organic light emitting display apparatus, however, the present invention is not limited thereto and can also be a PM type organic light emitting display apparatus.

Referring to FIG. 1, the organic light emitting display apparatus according to an embodiment of the present invention includes a substrate 10, an organic light emitting device 30, a sealing member 50, a semi-transparent film 51, a passivation film 52, a transmissive black layer 21, and a black matrix layer 22.

The substrate 10 can be formed of a transparent glass material having $SiO_2$ as a main component; however, the substrate 10 is not limited thereto. That is, the substrate 10 can be formed of a transparent plastic material. In the case of a bottom emission type organic light emitting display apparatus in which an image is displayed through the substrate 10, the substrate 10 is formed of a transparent material. However, as depicted in FIG. 1, in the case of a top emission type organic light emitting display apparatus in which an image is displayed through the sealing member 50, the substrate 10 does not have to be formed of a transparent material.

A buffer layer 11 can be formed on a surface (or an upper surface) of the substrate 10 to secure planarity (or smoothness) of the substrate 10 and to prevent (or reduce) impure elements from penetrating into the organic light emitting display apparatus. The buffer layer 11 can be formed of silicon oxide ($SiO_2$) and/or silicon nitride (SiNx).

A thin film transistor (TFT) is formed on the upper surface of the substrate 10. At least one TFT is formed in each pixel and is electrically connected to the organic light emitting device 30.

More specifically, in the TFT, a semiconductor layer 12 having a pattern (that may be predetermined) is formed on the buffer layer 11. The semiconductor layer 12 can be formed of an inorganic or organic semiconductor such as an amorphous silicon or poly silicon, and includes a source region, a drain region, and a channel region.

A gate insulating film 13 is on an upper surface of the semiconductor layer 12 and the buffer layer 11 and is formed of silicon oxide ($SiO_2$) and/or silicon nitride (SiNx). A gate electrode 14 is formed in a region (that may be predetermined) that is on an upper surface of the gate insulating film 13. The gate electrode 14 is connected to a gate line for applying an ON/OFF signal to the TFT.

An interlayer insulating layer 15 is formed on the gate electrode 14, and a source electrode 16 and a drain electrode 17 are respectively connected to the source region and the drain region of the semiconductor layer 12 through contact holes. The TFT is protected by a passivation film 18, which can be at least one of an inorganic insulating film and an organic insulating film. The inorganic insulating film can be formed of $SiO_2$, $SiN_x$, SiON, $Al_2O_3$, $TiO_2$, $Ta_2O_5$, $HfO_2$, $ZrO_2$, BST, and/or PZT. The organic insulating film can be formed of any suitable multi-purpose polymers such as polymethyl methacrylate or polystyrene, polymer derivatives having a phenol group, an acryl polymer, an imide polymer, an arylester polymer, an amide polymer, a fluoride polymer, a p-gilyrene polymer, a vinyl alcohol polymer, or mixtures of these polymers. The passivation film 18 can be formed as a composite stack of an inorganic insulating film and an organic insulating film.

A first electrode 31 utilized as an anode electrode of the organic light emitting device 30 is formed on the passivation film 18, and a pixel define layer 36 covering the first electrode 31 is formed of an insulating material. An opening (or a predetermined opening) is formed in the pixel define layer 36, and an organic light emitting layer 32 of the organic light emitting device 30 is formed in a region defined by the opening. A second electrode 33 utilized as a cathode electrode of the organic light emitting device 30 is formed to cover the entire pixel. The polarity of the first electrode 31 and the second electrode 33 may be reversed.

The organic light emitting device 30 displays an image by emitting light according to current flow, and includes the first electrode 31 electrically connected to the drain electrode 17 of the TFT through a contact hole, the organic light emitting layer 32, and the second electrode 33.

The first electrode 31 can be formed in a pattern that may be predetermined using a photolithography method. In a PM type organic light emitting display apparatus, the pattern of the first electrode 31 can be formed in a stripe shape separated by a distance that may be predetermined, and in an AM type organic light emitting display apparatus, the pattern of the first electrode 31 can be formed in a shape corresponding to the shape of the pixel. The second electrode 33 is disposed above the first electrode 31, and can be used as the cathode electrode by connecting to an external terminal. In the case of a PM type organic light emitting display apparatus, the second electrode 33 can be formed in a stripe shape crossing the pattern of the first electrode 31, and in the case of the AM type organic light emitting display apparatus, the second electrode 33 can be formed on the entire region where an image is displayed. The polarity of the first electrode 31 and the second electrode 33 may be reversed. In the case of a bottom emission type organic light emitting display apparatus in which an image is displayed through the substrate 10, the first electrode 31 is a transparent electrode, and the second electrode 33 can be a reflection electrode. Here, the first electrode 31 is formed of a material having a high work function such as ITO, IZO, ZnO, or $In_2O_3$, and the second electrode 33 can be formed of a metal having a low work function such as Ag, Mg, Al, Pt, Pd, Au, Ni, Nd, Ir, Cr, Li, or Ca.

In the case of a top emission type organic light emitting display apparatus in which an image is displayed through the second electrode 33, the first electrode 31 can be a reflection electrode, and the second electrode 33 can be a transparent electrode. In this case, the reflection electrode that functions as the first electrode 31 is formed on the reflection film using a material having a high work function such as ITO, IZO, ZnO, or $In_2O_3$. The reflection film is formed using a metal such as Ag, Mg, Al, Pt, Pd, Au, Ni, Nd, Ir, Cr, Li, Ca, or compounds of these metals. The transparent electrode that functions as the second electrodes 33 can be formed by depositing a metal such as Ag, Mg, Al, Pt, Pd, Au, Ni, Nd, Ir, Cr, Li, Ca, or compounds of these metals having a small work function and by forming an auxiliary electrode layer or a bus electrode line using a transparent conductive material such as ITO, IZO, ZnO, or $In_2O_3$ on the metal deposition.

In the case of a dual side emission type organic light emitting display apparatus, the first and second electrodes 31 and 33 can be formed as transparent electrodes.

The organic light emitting layer 32 that is interposed between the first electrode 31 and the second electrode 33 emits light by electrically driving the first electrode 31 and the second electrode 33. The organic light emitting layer 32 can be formed of a low molecular weight organic material or a polymer organic material. When the organic light emitting layer 32 is formed of a low molecular weight organic material, a hole transport layer (HTL) and a hole injection layer (HIL) are stacked on a surface of the organic light emitting layer 37 facing the first electrode 31, and an electron transport layer (ETL) and an electron injection layer (EIL) are stacked on a surface of the organic light emitting layer 32 facing the second electrode 33. Besides these layers, various other suitable layers can be stacked if necessary. The low molecular weight organic material of the organic light emitting layer 32 can be of formed of various suitable materials, such as copper phthalocyanine (CuPc), N,N'-Di(naphthalene-1-yl)-N,N'-diphenyl-benzidine (NPB), tris-8-hydroxyquinoline aluminum (Alq3), etc.

When the organic light emitting layer 32 is formed of a polymer organic material, only an HTL can be formed on a surface of the organic light emitting layer 37 facing the first electrode 31. Here, the polymer HTL can be formed on the first electrode 31 using poly-(2,4)-ethylene-dihydroxy thiophene (PEDOT) and/or polyaniline (PANI) by an inkjet printing method and/or a spin coating method. The polymer organic light emitting layer 32 can be formed of poly-phenylenevinylene (PPV), soluble PPV's, cyano-PPV, or polyfluorene, and a color pattern is formed using suitable method(s) such as an inkjet printing method, a spin coating method, and/or a thermal transcribing method using a laser.

The sealing member 50 that seals the organic light emitting device 30 is formed on the organic light emitting device 30. The sealing member 50 protects the organic light emitting device 30 from external moisture or oxygen. In the top emission type organic light emitting display apparatus as depicted in FIG. 1, the sealing member 50 is formed of a transparent material. For this purpose, the sealing member may be a glass substrate, a plastic substrate, or a multi-layered structure including organic and inorganic materials.

The semi-transparent film 51 that transmits a part of external light and reflects another part of the external light is formed on an upper surface of the sealing member 50 facing the outside (or away from the seating member). The semi-transparent film 51 may be formed to have reflectance ranging from about 1.5 to about 5 (or from 1.5 to 5). The semi-transparent film 51 can be formed from a metal colloid using a metal such as Ag, Au, and/or Ti. That is, the semi-transparent film 51 can be formed by an annealing process after a metal colloid film is coated by spin coating, dip coating and/or bar coating. The semi-transparent film 51 can be formed to have an optical transmittance ranging from about 40 to about 80% (or from 40 to 80%) by controlling the thickness of the semi-transparent film 51 and/or the process conditions for forming the metal colloid. The semi-transparent film 51 can be formed to have a thickness ranging from about 10 nm to about 10 μm (or from 10 nm to 10 μm). If the thickness of the semi-transparent film 51 is too thick, the optical transmittance of the semi-transparent film 51 is reduced and thus, resulting in reducing the optical efficiency of light emitted from the organic light emitting device 30. Therefore, in one embodiment, the semi-transparent film 51 is formed to a thickness of less than 10 μm.

By contrast, if the thickness of the semi-transparent film 51 is too thin, the optical transmittance of the semi-transparent film 51 may be increased to such a degree that external light can pass through the semi-transparent film 51. As a result, the amount of external light to be reflected by the reflection electrode increases.

The passivation film 52 is formed on the semi-transparent film 51. The passivation film 52 is formed to have a refractive index that is less than that of the semi-transparent film 51. The passivation film 52 is formed of a thermosetting resin having a relatively high impact resistance, such as urethane acrylate or epoxy resin. Thus, the passivation film 52 is transparent. More specifically, the passivation film 52 can be formed by a hardening process using annealing or ultraviolet rays after coating a film by spin coating, dip coating, and/or bar coating. The passivation film 52 can be formed to a thickness ranging from about 10 nm to about 30 μm (or from 10 nm to 30 μm). The passivation film 52 can be formed to a thickness of 10 nm or more to secure impact resistance. However, if the passivation film 52 is too thick, an overall thickness of the organic light emitting display apparatus may be increased too much. Therefore, in one embodiment, the passivation film 52 is formed to a thickness of 30 μm or less.

In one embodiment, the passivation film 52 is formed of a thermosetting resin with high impact resistance and able to protect the thin semi-transparent film 51 from external impact.

The organic light emitting display apparatus according to the present embodiment has a structure in which the semi-transparent film 51 and the passivation film 52 are formed as an overlapping structure on the sealing member 50 and the semi-transparent film 51 has a refractive index greater than that of the passivation film 52, thereby preventing (or reducing) the reflection of external light at an interface of the passivation film 52. That is, the combination of the semi-transparent film 51 and the passivation film 52 can function as a circular polarizer. In particular, the optical transmittance of the organic light emitting display apparatus according to the present embodiment can match the optical transmittance of a conventional circular polarizer by combining the semi-transparent film 51 having an optical transmittance ranging from about 40 to about 80% (or from 40 to 80%) and the passivation film 52 that is formed of a transparent material.

The transmissive black layer 21 is formed between the sealing member 50 and the organic light emitting device 30. Referring to FIG. 1, the transmissive black layer 21 is formed on a surface of the sealing member 50 facing the organic light emitting device 30. The transmissive black layer 21 can be formed of graphite or diamond like carbon (DLC) at a temperature of 250° C. or less to prevent (or reduce) the transmissive black layer 21 and organic light emitting device 30 from degradation using a sputtering method and/or a chemical vapor deposition (CVD) method.

The transmissive black layer 21 increases contrast of the organic light emitting display apparatus. In order to increase contrast of the organic light emitting display apparatus, the transmissive black layer 21 according to one embodiment has an appropriate (or suitable) optical transmittance. A low optical transmittance is advantageous for increasing contrast of the organic light emitting display apparatus. However, the low optical transmittance reduces the extraction rate of light generated from the organic light emitting device 30. In particular, the optical transmittances of the semi-transparent film 51 and the passivation film 52 should also be considered. In one embodiment, the transmissive black layer 21 is formed to have an optical transmittance ranging from about 35 to about 80% (or from 35 to 80%) and thus, the optical transmittance of the organic light emitting display apparatus according to the present embodiment can be controlled to be in a range from about 40 to about 60% (or from 40 to 60%) even when the transmissive black layer 21, the semi-transparent film 51, and the passivation film 52 are simultaneously used. That is, the organic light emitting display apparatus according to the present embodiment can prevent (or reduce) reflection of external light and can increase contrast while maintaining an optical transmittance of about 40%, which is the optical transmittance of a conventional circular polarizer (or even higher) when the transmissive black layer 21, the semi-transparent film 51, and the passivation film 52 are used together. The transmissive black layer 21 can include 5 to 35 wt % of hydrogen so that the transmissive black layer 21 that is formed of graphite or DLC can have a desired optical transmittance.

The desired optical transmittance of the organic light emitting display apparatus can be obtained by controlling the thickness of the transmissive black layer 21. Thus, in order to increase the optical transmittance of the organic light emitting display apparatus, the thickness of the transmissive black layer 21 is increased, and in order to reduce the optical transmittance of the organic light emitting display apparatus, the thickness of the transmissive black layer 21 is reduced. The transmissive black layer 21 having a desired optical transmittance can be obtained by forming the transmissive black layer 21 to a thickness ranging from about 5 to about 70 nm (or from 5 to 70 nm).

The transmissive black layer 21 having an appropriate thickness can be formed by considering conditions of the semi-transparent film 51, the passivation film 52, and the organic light emitting display apparatus that are utilized according to the present embodiment.

Here, the contrast of the organic light emitting display apparatus according to the present embodiment can be further increased due to the formation of the transmissive black layer 21.

The black matrix layer 22 can be formed on the transmissive black layer 21. The black matrix layer 22 is patterned to be disposed in a non-display region of the organic light emitting device 30. A display region of the organic light emitting device 30 is a region where the organic light emitting layer 32 is located, and the non-display region of the organic light emitting device 30 is remaining region where the organic light emitting layer 32 is not located. The black matrix layer 22 can be formed of graphite and/or chrome having a relatively high dark color in order to absorb external light, however, the black matrix layer 22 can also be formed of any suitable material that can absorb external light.

The organic light emitting display apparatus according to the present embodiment includes the semi-transparent film 51 and the passivation film 52 on the sealing member 50, the passivation film 52 having a refractive index lower than that of the semi-transparent film 51 and having a relatively high impact resistance. Thus, the reflection of external light, in particular, at an interface of the substrate 10 can be reduced and an external surface of the organic light emitting display apparatus can be protected from external impact.

Also, the transmissive black layer 21 is formed between the organic light emitting device 30 and the sealing member 50 in order to control the optical transmittance of the organic light emitting display apparatus, thereby increasing contrast of the organic light emitting display apparatus. The contrast of the organic light emitting display apparatus can be further increased by forming the black matrix layer 22 in the non-display region of the organic light emitting device 30.

Figure 2:
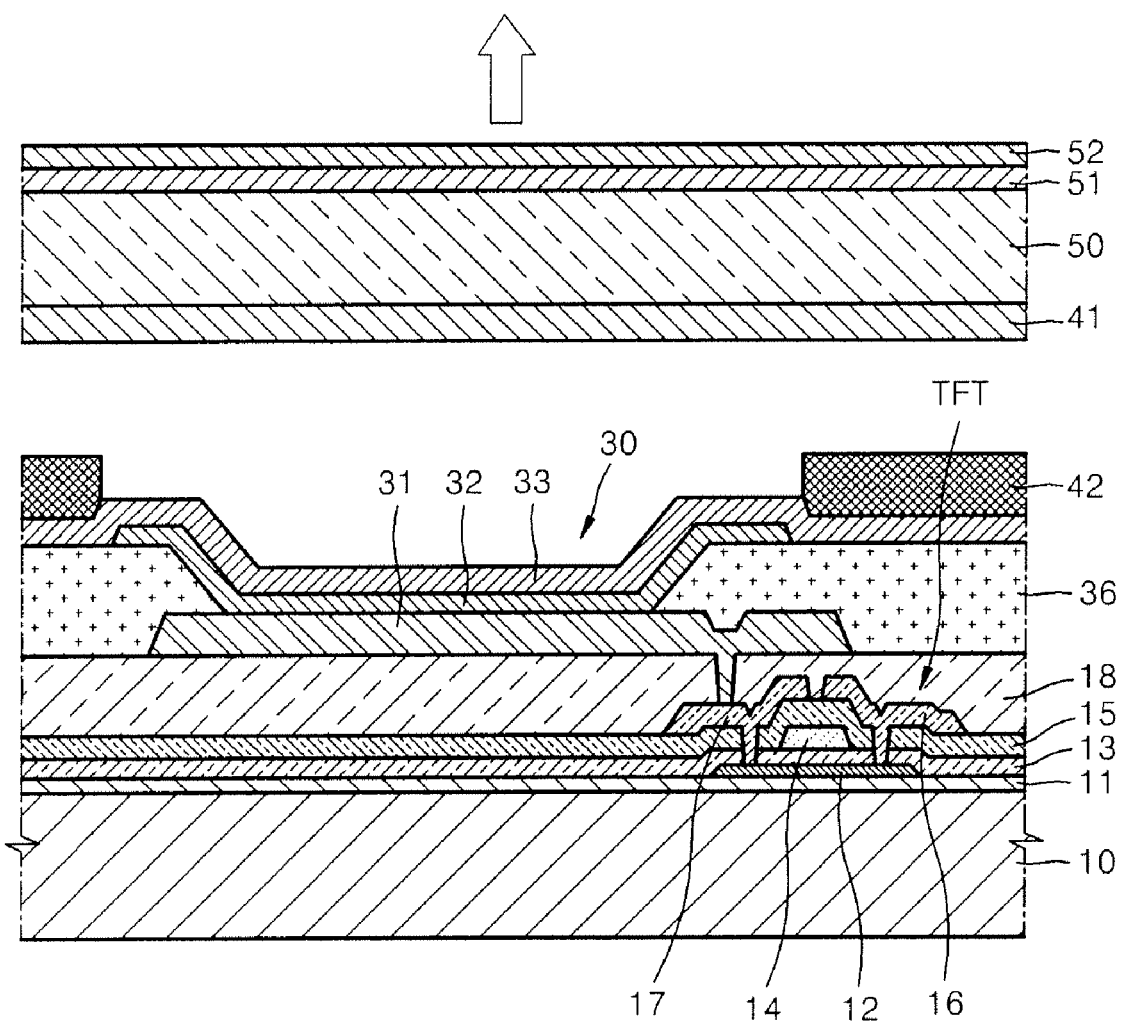
FIGS. 2, 3, and 4 are schematic cross-sectional views illustrating modified versions of the organic light emitting display apparatus of FIG. 1, according to an embodiment of the present invention.
Figure 3:
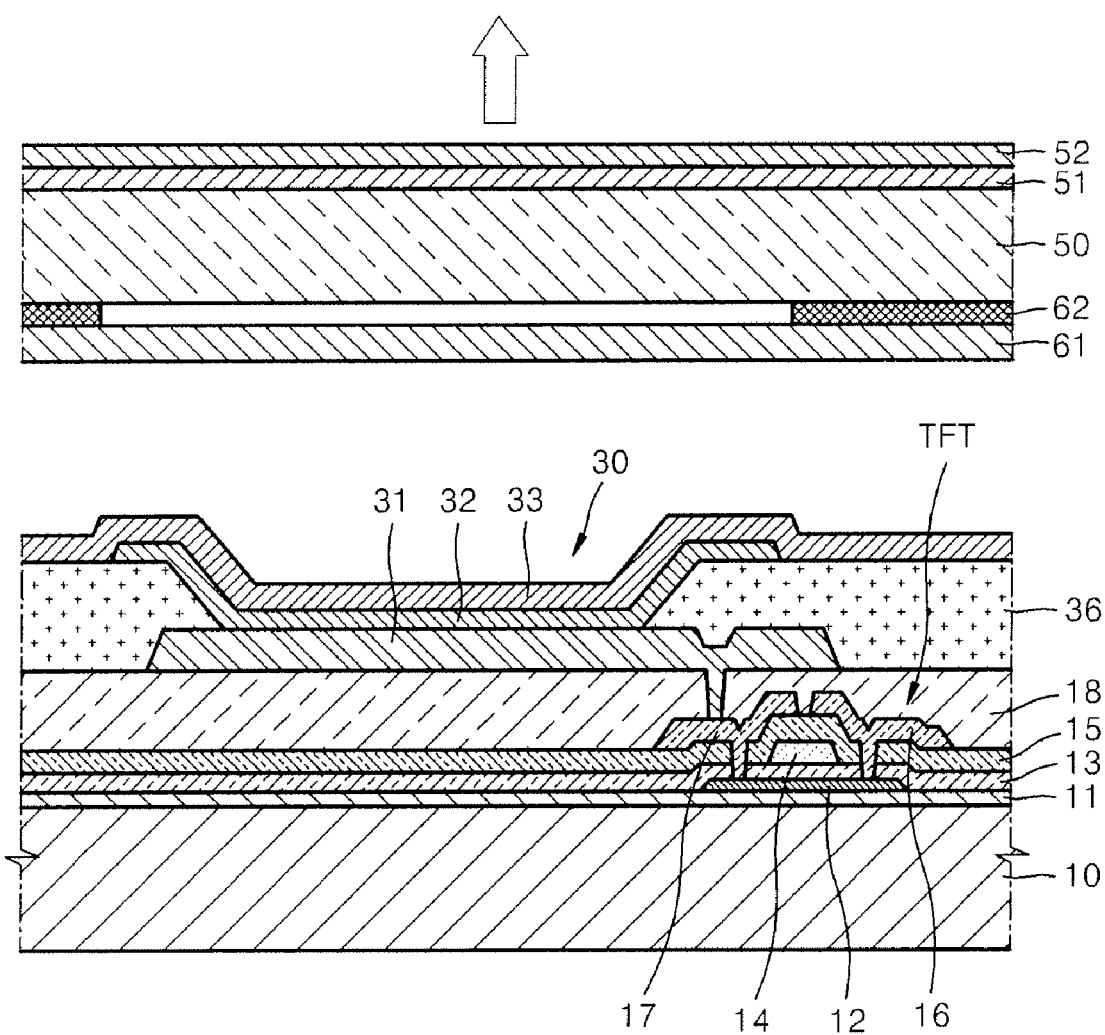
Figure 4:
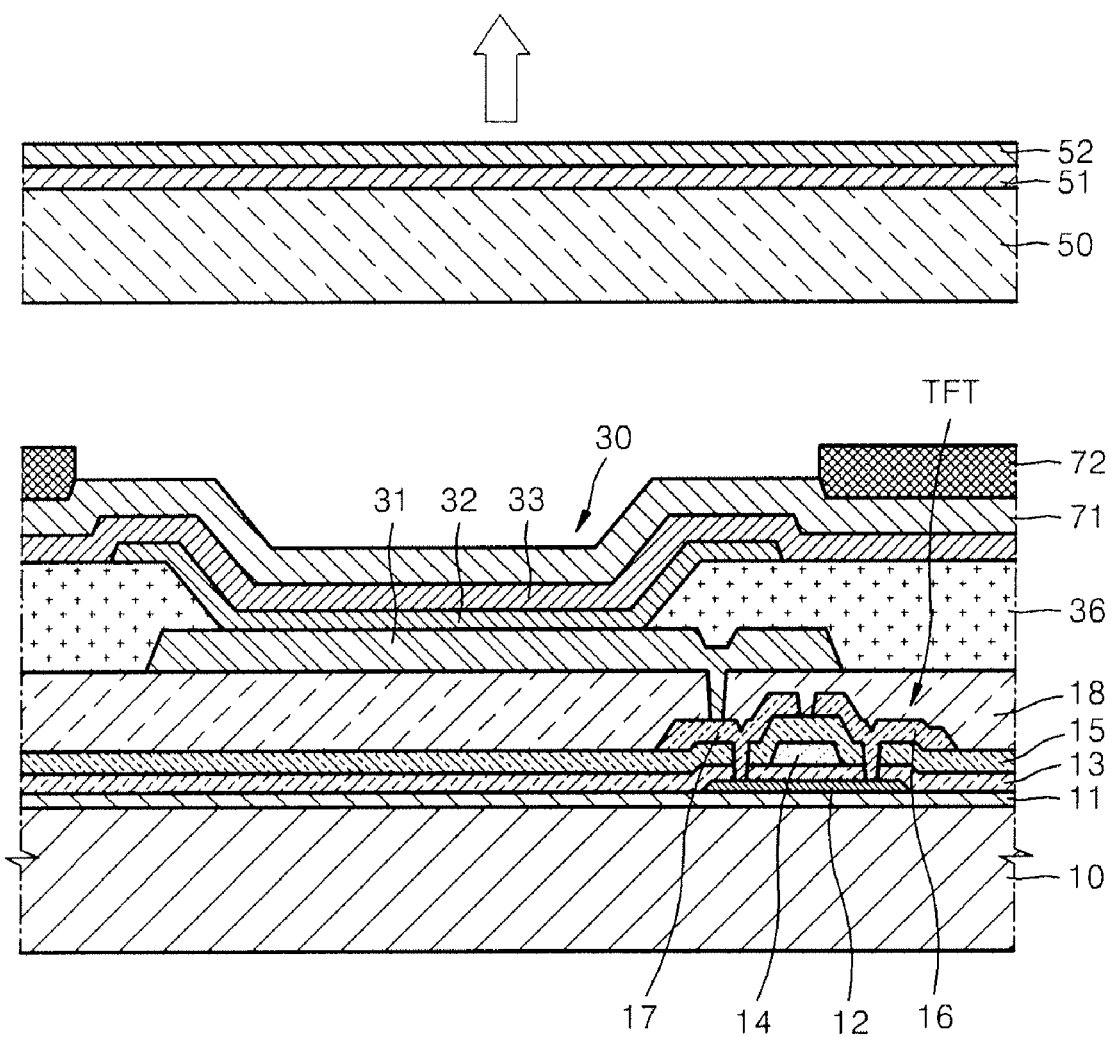

FIGS. 2 through 4 are schematic cross-sectional views illustrating modified versions of the organic light emitting display apparatus of FIG. 1, according to other embodiments of the present invention. Hereinafter, the differences from the organic light emitting display apparatus of FIG. 1 will be described in more detail.

Referring to FIG. 2, the organic light emitting display apparatus according to the present embodiment includes the substrate 10, the organic light emitting device 30, the sealing member 50, the semi-transparent film 51, the passivation film 52, a transmissive black layer 41, and a black matrix layer 42. The transmissive black layer 41 is formed on a surface of the sealing member 50 facing the organic light emitting device 30. The black matrix layer 42 is formed on the second electrode 33. The rest of the structure is identical (or substantially identical) to the organic light emitting display apparatus of FIG. 1, and thus, the detailed description thereof will not be provided again.

Referring to FIG. 3, the organic light emitting display apparatus according to the present embodiment includes the substrate 10, the organic light emitting device 30, the sealing member 50, the semi-transparent film 51, the passivation film 52, a transmissive black layer 61, and a black matrix layer 62. The black matrix layer 62 and the transmissive black layer 61 are sequentially formed on a surface of the sealing member 50 facing the organic light emitting device 30. In more detail, the black matrix layer 62 is formed between the sealing member 50 and the transmissive black layer 61.

Referring to FIG. 4, the organic light emitting display apparatus according to the present embodiment includes the substrate 10, the organic light emitting device 30, the sealing member 50, the semi-transparent film 51, the passivation film 52, a transmissive black layer 71, and a black matrix layer 72. The transmissive black layer 71 is formed on the second electrode 33 of the organic light emitting device 30. The patterned black matrix layer 72 is formed on the transmissive black layer 71.

Figure 5:
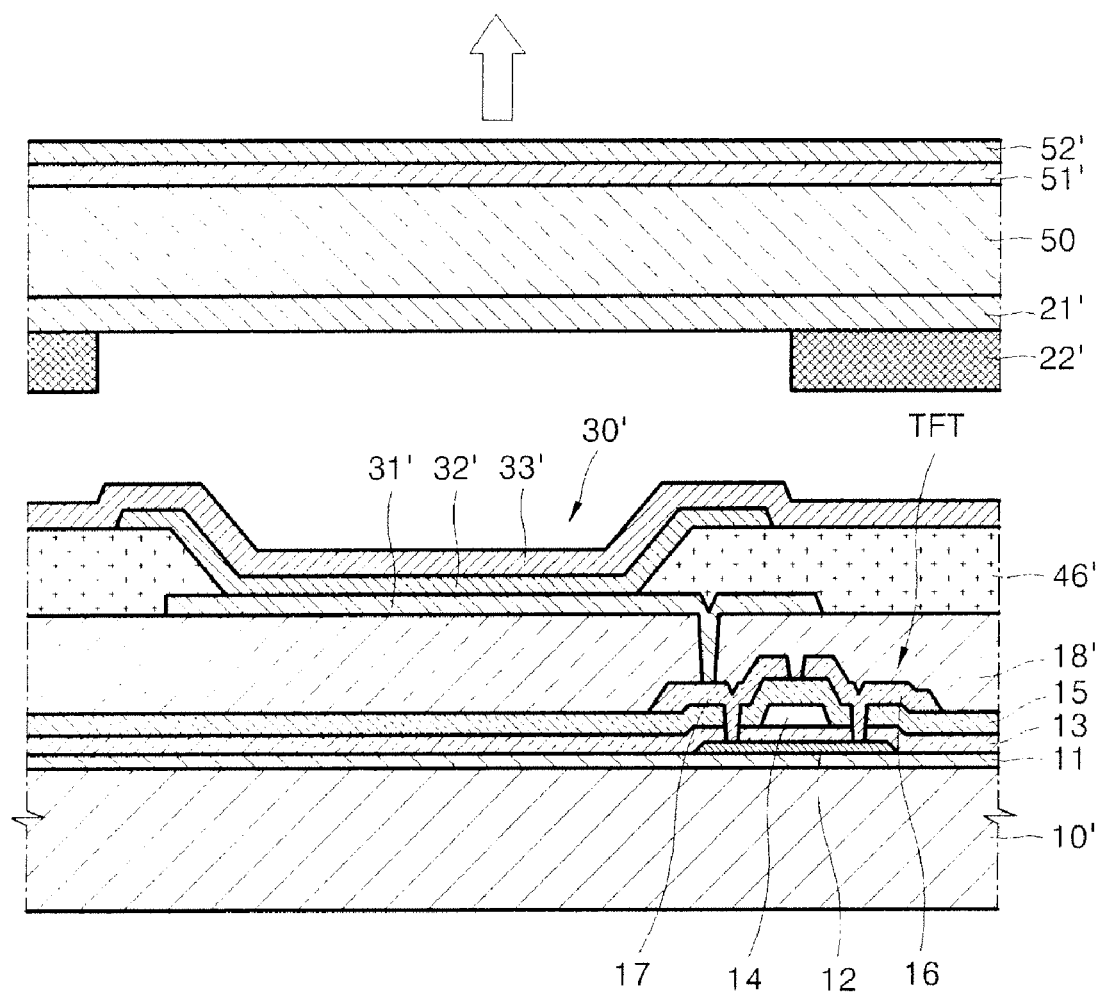
FIG. 5 is a schematic cross-sectional view illustrating an organic light emitting display apparatus according to another embodiment of the present invention.

FIG. 5 is a schematic cross-sectional view illustrating an organic light emitting display apparatus according to another embodiment of the present invention. The differences between the organic light emitting display apparatus of FIG.

5 and the organic light emitting display apparatus of FIG. 1 will be described in more detail.

Referring to FIG. 5, the organic light emitting display apparatus according to the present embodiment includes a substrate 10', an organic light emitting device 30', a sealing member 50', a semi-transparent film 51', a passivation film 52', a pixel define film 46', a transmissive black layer 21', and a black matrix layer 22'.

A first electrode 31' utilized as an anode electrode of the organic light emitting device 30' is formed on a passivation film 18', and the pixel define layer 46' covering the passivation film 18' is formed using an insulating material. An opening (or predetermined opening) is formed in the pixel define layer 46', and an organic light emitting layer 32' of the organic light emitting device 30' is formed in a region defined by the opening. A second electrode 33' utilized as a cathode electrode of the organic light emitting device 30' is formed to cover the entire pixels. The polarity of the first electrode 31' and the second electrode 33' may be reversed. Here, in FIG. 5, the pixel define layer 46' according to one embodiment is formed of an insulating layer and to have a relatively dark color (e.g., a black color), and, in this case, the reflection of external light can be reduced (or minimized), thereby further increasing contrast of the organic light emitting display apparatus.

The organic light emitting display apparatus of FIG. 5 can also be modified as the organic light emitting display apparatus of FIG. 1 is modified as illustrated in FIGS. 2 through 4.

An organic light emitting display apparatus according to an embodiment of the present invention has high (or improved) contrast and/or impact resistance.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display apparatus comprising:
   a substrate;
   an organic light emitting device on the substrate to display an image;
   a sealing member for sealing the organic light emitting device;
   a semitransparent film on a surface of the sealing member facing away from the organic light emitting device to transmit a portion of external light and to reflect another portion of the external light;
   a passivation film on the semitransparent film to protect the semitransparent film;
   a transmissive black layer between the sealing member and the organic light emitting device to increase contrast; and
   a black matrix layer on a surface of the transmissive black layer facing the organic light emitting device,
   wherein the semitransparent film has a refractive index greater than that of the passivation film.

2. The organic light emitting display apparatus of claim 1, wherein the transmissive black layer comprises graphite or diamond like carbon (DLC).

3. The organic light emitting display apparatus of claim 1, wherein the passivation film comprises a thermosetting resin.

4. The organic light emitting display apparatus of claim 3, wherein the thermosetting resin of the passivation film comprises a urethane acrylate or an epoxy resin.

5. The organic light emitting display apparatus of claim 1, wherein the semitransparent film has an optical transmittance ranging from about 40 to about 80%.

6. The organic light emitting display apparatus of claim 1, wherein the semitransparent film has the refractive index ranging from about 1.5 to about 5.0.

7. The organic light emitting display apparatus of claim 1, wherein the semitransparent film comprises a metal colloid layer.

8. The organic light emitting display apparatus of claim 1, wherein the semitransparent film comprises Ag, Au, or Ti.

9. An organic light emitting display apparatus comprising:
   a substrate;
   an organic light emitting device on the substrate to display an image, the organic light emitting device comprising the common electrode;
   a sealing member for sealing the organic light emitting device;
   a semitransparent film on a surface of the sealing member facing away from the organic light emitting device to transmit a portion of external light and to reflect another portion of the external light;
   a passivation film on the semitransparent film to protect the semitransparent film;
   a black matrix layer in a region corresponding to a non-display region of the organic light emitting device; and
   a transmissive black layer between the sealing member and the organic light emitting device to increase contrast,
   wherein the semitransparent film has a refractive index greater than that of the passivation film, and
   wherein the black matrix layer is directly on a surface of the common electrode of the organic light emitting device facing the transmissive black layer.

10. An organic light emitting display apparatus comprising:
   a substrate;
   an organic light emitting device on the substrate and comprising a first electrode, a second electrode, and an organic light emitting layer between the first electrode and the second electrode;
   an insulating film on the first electrode and comprising an opening to expose a portion of the first electrode;
   a sealing member for sealing the organic light emitting device;
   a semitransparent film on a surface of the sealing member facing away from the organic light emitting device to transmit a portion of external light and to reflect another portion of the external light;
   a passivation film on the semitransparent film to protect the semitransparent film;
   a transmissive black layer between the sealing member and the organic light emitting device to increase contrast; and
   a black matrix layer on a surface of the transmissive black layer facing the organic light emitting device,
   wherein the organic light emitting layer and the second electrode are sequentially disposed on the portion of the first electrode exposed through the opening defined by the insulating film,
   wherein the semitransparent film has a refractive index greater than that of the passivation film, and
   wherein the insulating film has a dark color to reduce reflection of the external light.

11. An organic light emitting display apparatus comprising:
   a substrate;

an organic light emitting device on the substrate and comprising a first electrode, a second electrode, and an organic light emitting layer between the first electrode and the second electrode;

an insulating film formed on the first electrode and comprising an opening in order to expose a portion of the first electrode;

a sealing member for sealing the organic light emitting device;

a semitransparent film on a surface of the sealing member facing away from the organic light emitting device to transmit a portion of external light and to reflect another portion of the external light;

a passivation film on the semitransparent film to protect the semitransparent film;

a black matrix layer in a region corresponding to a non-display region of the organic light emitting device; and a transmissive black layer between the sealing member and the organic light emitting device to increase contrast, wherein the organic light emitting layer and the second electrode are sequentially disposed on the portion of the first electrode exposed through the opening defined by the insulating film, wherein the semitransparent film has a refractive index greater than that of the passivation film, and wherein the black matrix layer is located directly on a surface of the transmissive black layer facing the sealing member.

12. The organic light emitting display apparatus of claim 11, wherein the transmissive black layer comprises graphite or diamond like carbon (DLC).

13. The organic light emitting display apparatus of claim 11, wherein the passivation film comprises a thermosetting resin.

14. The organic light emitting display apparatus of claim 13, wherein the thermosetting resin of the passivation film comprises a urethane acrylate or an epoxy resin.

15. The organic light emitting display apparatus of claim 11, wherein the semitransparent film has an optical transmittance ranging from about 40 to about 80%.

16. The organic light emitting display apparatus of claim 11, wherein the semitransparent film has the refractive index ranging from about 1.5 to about 5.0.

17. The organic light emitting display apparatus of claim 11, wherein the semitransparent film comprises a metal colloid layer.

18. The organic light emitting display apparatus of claim 11, wherein the semitransparent film comprises Ag, Au, or Ti.

19. The organic light emitting display apparatus of claim 11, wherein the insulating film is a dark color to reduce reflection of the external light.

20. The organic light emitting display apparatus of claim 11, wherein the black matrix layer is adapted to absorb the external light.

21. The organic light emitting display apparatus of claim 11, wherein the transmissive black layer is located on the second electrode at a side facing the sealing member.

22. The organic light emitting display apparatus of claim 11, wherein the black matrix layer is located on the sealing member at a side facing the organic light emitting device.

* * * * *